US010067718B2

(12) United States Patent
Covington et al.

(10) Patent No.: US 10,067,718 B2
(45) Date of Patent: Sep. 4, 2018

(54) MULTI-PURPOSE REGISTER PAGES FOR READ TRAINING

(71) Applicant: Advanced Micro Devices, Inc., Sunnyvale, CA (US)

(72) Inventors: Glennis Eliagh Covington, Austin, TX (US); Kevin M. Brandl, Austin, TX (US); Nienchi Hu, Sunnyvale, CA (US); Shannon T. Kesner, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 175 days.

(21) Appl. No.: 15/274,178

(22) Filed: Sep. 23, 2016

(65) Prior Publication Data
US 2018/0088862 A1 Mar. 29, 2018

(51) Int. Cl.
*G06F 12/00* (2006.01)
*G06F 3/06* (2006.01)

(52) U.S. Cl.
CPC .......... *G06F 3/0659* (2013.01); *G06F 3/0604* (2013.01); *G06F 3/0683* (2013.01)

(58) Field of Classification Search
None
See application file for complete search history.

(56) References Cited

U.S. PATENT DOCUMENTS

2011/0066903 A1\* 3/2011 Foster, Sr. .............. G06F 1/206
714/723

\* cited by examiner

*Primary Examiner* — Duc Doan

(57) ABSTRACT

Dynamic random access memory (DRAM) chips in memory modules include multi-purpose registers (MPRs) having pre-defined data patterns which, when selected, are accessed with read commands and output on data lines for performing read training. The MPRs are accessed by issuing read commands to specific register addresses to request reads from specific MPR locations. In some embodiments, read training for memory modules includes addressing, for a first half of a memory module, a read command to a first register address and performing read training using a first set of bit values received in response to addressing using the first register address. For a second half of the memory module, the same read command is used, but read training is performed using a second set of bit values received in response to addressing using the first register address.

20 Claims, 4 Drawing Sheets

US 10,067,718 B2

MULTI-PURPOSE REGISTER PAGES FOR READ TRAINING

BACKGROUND

Description of the Related Art

Processing systems, such as systems-on-a-chip (SOCs), use memory to store data or instructions for later use. For example, an SOC may include processing units such as central processing units (CPUs), graphics processing units (GPUs), and accelerated processing units (APUs) to read instructions or data from memory, perform operations using the instructions or data, and then write the results back into the memory. Processing systems may include a memory physical layer interface for controlling access to a memory module, such as dynamic random access memory (DRAM), that is used to store information so that the stored information is accessed by the processing units during operation of the processing system. The memory physical layer interface in a processing system is conventionally referred to as a "memory PHY." A memory controller is typically used to control operation of the memory PHY.

The memory PHY is typically trained using sequences exchanged over an interface between the memory PHY and the DRAM before data is able to be accurately read from the DRAM or written to the DRAM. The memory PHY interfaces with the DRAM via a set of access signals such as control signals, signals representing memory addresses, signals representing data returned from the DRAM, and the like. To properly interpret signals provided by the DRAM, the memory PHY reads or latches the signal at specified intervals or instances, referred to herein as "data eyes." Because of manufacturing variations and other variables, the proper signal access times vary between processing systems having the same design. Accordingly, to ensure signals received from the DRAM are able to be properly interpreted, the processing system implements a training protocol, whereby the signal access times for the memory PHY are adjusted based on a set of training sequences between the memory PHY and the DRAM. The training sequence for the signal training protocols may include a random mix of "1s" and "0s" that are read from and/or written to multi-purpose registers (MPRs) in the DRAM. Signals returned from the DRAM in response to the training sequence are used to determine the contour of a data eye, which is a plot that shows the rising edge, the falling edge, and the high/low voltages that represent a value of a data signal as a function of time and voltage.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
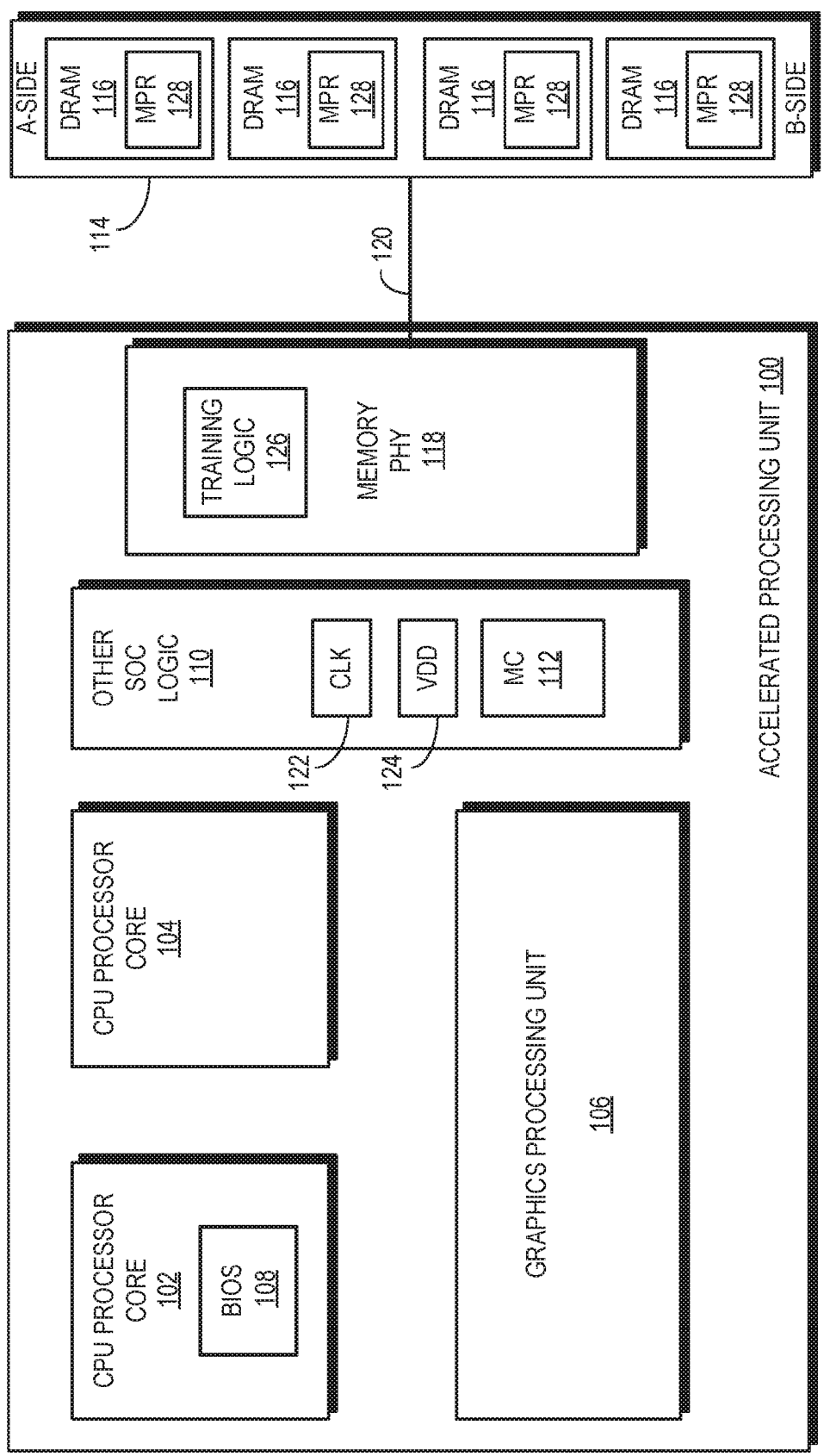
FIG. 1 is a block diagram of an accelerated processing unit (APU) that includes one or more central processing unit (CPU) processor cores according to some embodiments.

As discussed herein, DRAM chips in certain memory modules (e.g., dual inline memory modules [DIMM]) include multi-purpose registers (MPRs) that function as a scratch pad for the DRAM chips. Memory modules use MPRs having a pre-defined data patterns which, when selected, is output on data lines instead of normal data from the memory module. The MPRs are programmed using a command/address (C/A) bus. These registers, once programmed, are accessed with read commands to drive the MPR bits onto a data bus during read training. The training program is typically a software program stored in a basic input/output system (BIOS) memory device, but may also be implemented within other device hardware. The training program executes an algorithm, which determines appropriate timing delays associated with signals from the memory modules. Read leveling (or otherwise known as read training) is initiated by giving read commands to the memory module and trying to capture the pre-defined data patterns by adjusting the internal delays at which data signals from the DRAM chips are read. This process is repeated until the internal delays on the reads are adjusted to create a proper window for best capturing the pre-defined data patterns.

The MPRs are accessed by issuing read commands to specific bank address bits (e.g., BA[1:0] as further described herein) to request reads from specific MPR locations. The bank address bits BA1:BA0 are used to indicate MPR location, and the registers at the specified MPR location are accessed with the read command to drive the bit patterns onto a data (DQ)/timing (strobe) (DQS) bus for transfer to a memory controller for read training. However, training errors can occur due to the bank address pins for BA1 and BA0 being invertible. In particular, bank address pins for BA[1:0] are directly connected to the DRAM chips on a first half of the memory module but the bank address pins are inverted to the DRAM chips on a second half of the memory module.

Read commands to the second half of the memory module will result in the returning of unexpected data patterns from BA addresses due to pin inversion. Accordingly, this inversion of BA address bits needs to be corrected to obtain proper read training results. In some embodiments, read training for memory modules having inverted pins is accomplished by addressing, for a first half of a memory module, a read command to a first register address in a multi-purpose register (MPR) of a first dynamic random access memory (DRAM) chip, and receiving, in response to addressing the read command to the first register address, a first set of bit values stored at a first register associated with the first register address and performing read training for the first DRAM chip using the first set of bit values. For a second half of the memory module, the read command is addressed to the first register address in an MPR of a second DRAM chip on the memory module. Although addressed to the same first register address, a second set of bit values stored at a second register associated with a second register address is received. Read training for the second DRAM chip on the second half of the memory module is performed by anticipating this different set of bit values due to pin inversion and performing training using the second set of bit values.

FIG. 1 is a block diagram of an accelerated processing unit (APU) 100 that includes one or more central processing unit (CPU) processor cores 102, 104 and a graphics processing unit (GPU) 106 according to some embodiments. The APU 100 is implemented as a system-on-a-chip (SOC). The CPU processor cores 102, 104 can execute instructions independently, concurrently, or in parallel. Although the APU 100 shown in FIG. 1 includes two CPU processor cores 102, 104, persons of ordinary skill in the art having benefit of the present disclosure should appreciate that the number of processor cores in the APU 100 is a matter of design choice. In some embodiments, the APU 100 includes more or fewer than the two CPU processor cores 102, 104 shown in FIG. 1. The GPU 106 is used for rendering visual images intended for output to a display. Some embodiments of the GPU 106 also include multiple processing cores (not shown).

The CPU processor core 102 includes a basic input/output system (BIOS) 108 that is implemented in hardware, firmware, software, or a combination thereof. The BIOS 108 is used to initialize or test components of the APU 100, e.g., in response to a system including the APU 100 being powered on or booted up. The BIOS 108 is used to load an operating system. Instructions or commands generated by the BIOS 108 are conveyed to other locations in the APU 100 using one or more data pipelines (not shown in FIG. 1). The BIOS 108 alternatively is implemented in the CPU processor core 104 or other locations within the APU 100.

The APU 100 shown in FIG. 1 also includes other SOC logic 110. Some embodiments of the other SOC logic 110 include a DMA engine (not shown) for generating addresses and initiating memory read or write cycles, for performing memory-to-memory data transfer, or for transferring data between the CPU processor cores 102, 104 or the GPU 106. The other SOC logic 110 includes routing logic, coherency logic, or logic to implement other functionality. As shown, the other SOC logic 110 includes a memory controller (MC) 112 to coordinate the flow of data between the APU 100 and other memory such as an external memory module 114. In the embodiment of FIG. 1, the memory module 114 includes double data rate (DDR) dynamic random access memory (DRAM) chips 116, in which case the memory controller 112 is capable of transferring data to and from the memory module 114 on both the rising and falling edges of a memory clock. The memory module 114 supports memory protocols, such as the Joint Electron Device Engineering Council (JEDEC) Double Data Rate Fourth Generation (DDR4) protocol and other protocols. The memory controller 112 includes logic used to control reading information from the memory module 114 and writing information to the memory module 114. The memory controller 112 also includes refresh logic that is used to periodically re-write information to the memory module 114 so that information in the DRAM chips 116 of the memory module 114 is retained.

The memory controller 112 controls the operation of other memory modules, such as the memory module 114, using signals transmitted via a memory physical layer interface 118, which may be referred to as a memory PHY 118. The memory PHY 118 includes the circuitry used to drive signals that govern operation of memory modules that may be coupled to the APU 100. For example, the memory PHY 118 provides signals via memory bus 120 that control reading, writing, refreshing, or erasing portions of the memory module 114, such as the DRAM 116. The memory PHY 118 operates at different operating points, which may be determined by an operating frequency and/or operating voltage of the memory PHY 118. For example, the other SOC logic 110 may include a clock (CLK) 122 that provides a clock signal to govern synchronization in the memory PHY 118 and/or the memory controller 112 and a reference voltage (VDD) 124 that governs the voltage used by the memory PHY 118 and/or the memory controller 112.

The memory PHY 118 is trained in order to improve the read or write performance during communication between the memory PHY 118 and the DRAM 116. This read or write training generally occurs upon power on of a processing system containing the APU 100, in response to a reset of the processing system, and the like. The memory PHY 118 includes training logic 126 that is used to generate training sequences or commands, transmit the training sequences or commands to the DRAM 116 of the memory module 114, receive signals generated by the DRAM 116 in response to the transmitting sequences or commands, and adjust the read/write parameters of the memory PHY 118 based on the responses from the DRAM 116. In some embodiments, the training logic 126 is alternatively be implemented in the BIOS 108 instead of in the memory PHY 118 as illustrated in FIG. 1.

Each of the DRAM chips 116 include one or more multi-purpose registers (MPRs) 128 used for bit pattern storage. The MPRs 128 are accessed with read commands that are issued to their respective DRAM chips 116 from the memory PHY 118. In one embodiment, each MPR 128 includes four logical pages (e.g. MPR, Pages 0-3), and wherein there are four 8-bit registers per page. Each 8-bit register stores a different fixed, pre-defined bit pattern that is used for read training.

In one embodiment, read training is accomplished by addressing the DRAM chips 116 to request a particular one of the bit patterns to be read from its associated MPR 128. The received pattern is compared to an expected pattern to determine whether a read error has occurred and for conducting read training. However, the MPRs 128 from the two different sides of memory module 114 (e.g., A-Side and B-Side) will return bit patterns from different registers when addressed with the same read command due to address pin inversions (as further described in connection with FIG. 2 below). Read training will fail if the memory PHY 118 expects the same data pattern to be returned from both sides. The memory PHY 118 compensates for the address pin inversions by addressing both sides of the memory module 114 with the same register address, and comparing a first data pattern associated with the register address to be returned from one side of the memory module 114 with a corresponding test pattern and comparing a second data pattern associated with the inverse of the register address to be returned from the second side of the memory module 114 with a different corresponding test pattern. The memory PHY 118 thereby simplifies the training process relative to conventional processing systems that separately address the different sides of a memory module.

Figure 2:
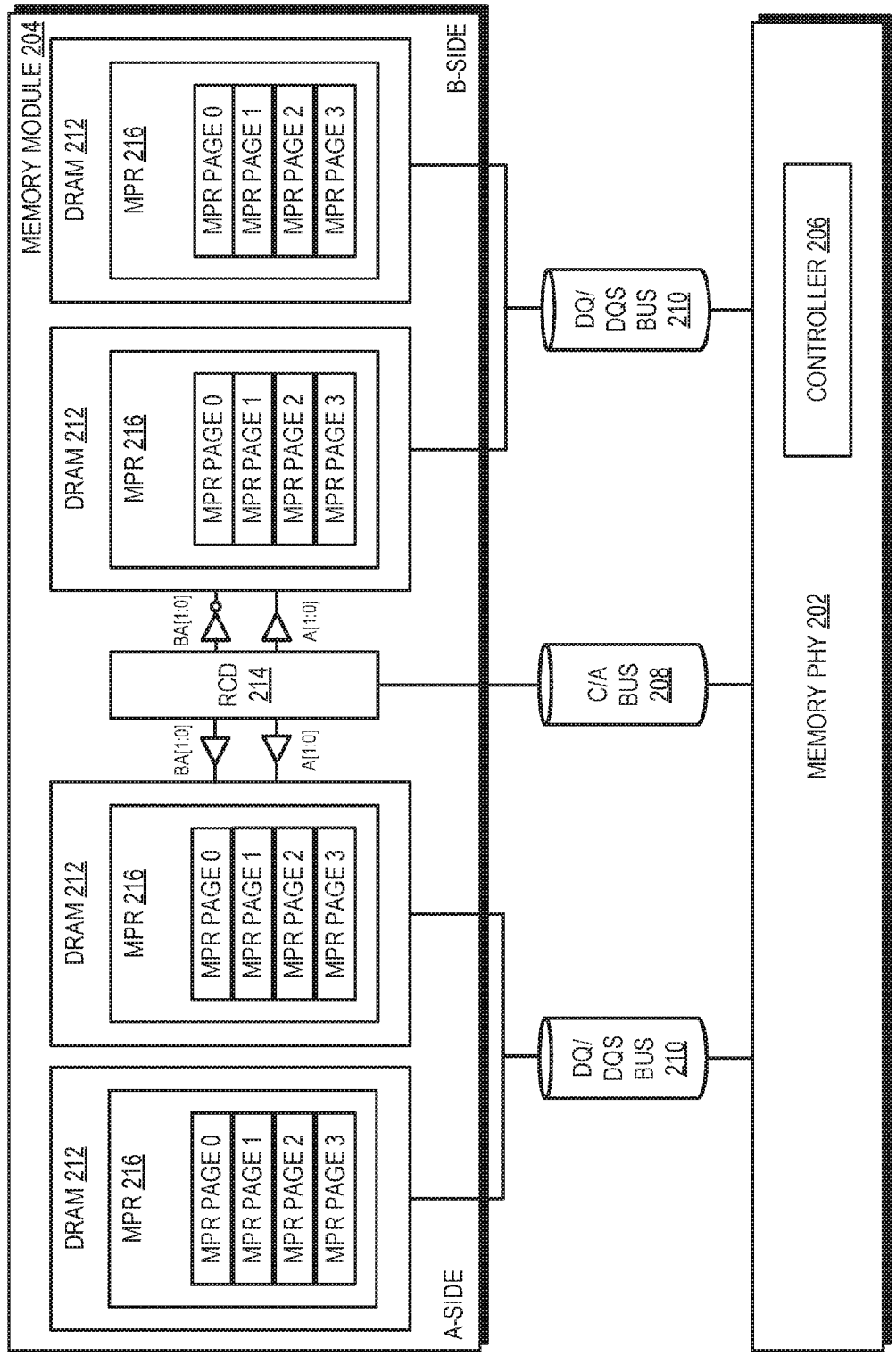
FIG. 2 is a block diagram of a portion of a processing unit that includes a DRAM and multi-purpose registers (MPRs) according to some embodiments.

FIG. 2 is a block diagram of a portion 200 of a processing unit that includes a memory PHY 202 and a memory module 204, such as the memory PHY 118 and the memory module 114 shown in FIG. 1, according to some embodiments. The memory PHY 202 includes a controller 206 that is used to control read training and write training of the memory PHY 202 for communication with the memory module 204. Some embodiments of the controller 206 may be implemented in hardware, firmware, software, or a combination thereof. The controller 206 may also be referred to as a microcontroller 206 in some embodiments. The controller 206 initiates training in response to power up, vertical retrace frequency changes, power state transitions (e.g., between idle and active states), periodically at a predetermined frequency, or in response to other events or signals. The controller 206 interacts with a BIOS, such as the BIOS 108 shown in FIG.

1. In some embodiments, the BIOS configures the controller 206 by providing configuration information associated with the memory module 204 or instructing the controller 206 to initiate a training sequence in response to a system reset. However, once the controller 206 has been configured, some embodiments of the controller 206 also control training of the memory PHY 202 substantially independently of the BIOS and substantially without input from the BIOS.

The memory PHY 202 and memory module 204 are communicably coupled via a memory bus that includes a command and address (C/A) bus line 208 and data bus lines 210 (e.g., DQ/DQS bus lines 210) on which read and write data is transmitted between the memory PHY 202 and memory module 204. The memory PHY 202 and controller 206 are used to drive data (DQ) or timing (DQS) signals onto or receive the DQ/DQS signals via the data bus lines 210. Further, the memory PHY 202 and controller 206 are used to drive addresses (ADDR) or commands (CMD) over the C/A bus line 208 to the memory module 204, where the ADDR and/or CMD signals are received at a registered clock driver (RCD) 214 that buffers and re-drives command and address signals to the DRAM chips 212.

In the embodiment of FIG. 2, the memory module 204 includes DRAM chips 212 that each include one or more multi-purpose registers (MPRs) 216 used for bit pattern storage. The MPRs 216 are accessed with read commands that are issued to their respective DRAM chips 212. Each MPR 216 includes four logical pages (e.g., MPR, Pages 0-3), and wherein each page has four MPR locations. For example, in one embodiment, the four MPR locations are each represented as 8-bit programmable registers that are used for bit pattern storage. Each 8-bit register stores a different bit pattern that is used for read training. However, those skilled in the art will recognize that the MPR locations can include registers having bit patterns of any bit length.

The memory PHY 202 and controller 206 issues a read command to the memory module 204, where the read command is received at the RCD 214. The RCD 214 forwards the read commend to the DRAMs 212, which includes addressing address bits A1:A0 (e.g., A[1:0] as illustrated in FIG. 2) and bank address bits BA1:BA0 (e.g., BA[1:0] as illustrated in FIG. 2). The two bit A1:A0 values are used to indicate which of the MPR pages (e.g., MPR pages 0-3) are selected, and the two bit BA1:BA0 values are used to indicate the MPR location (e.g., MPR0-MPR3) within the selected MPR page from which bit patterns are read. For example, when the bit value "00" is addressed to A1:A0, MPR page 0 is selected. Similarly, addressing A1:A0 using bit value "01" selects MPR page 1, addressing A1:A0 using bit value "10" selects MPR page 2, and addressing A1:A0 using bit value "11" selects MPR page 3.

Within the selected MPR page, the bank address bits BA1:BA0 are used to indicate the MPR location from which bit patterns should be read, and the registers at the specified MPR location are accessed with the read command to read the bit patterns onto the DQ/DQS bus 210 for transfer to the memory PHY 202 during read training. The bit pattern received at the memory PHY 202 is compared to an expected pattern for performing read training. However, training errors can occur due to the bank address pins for BA1 and BA0 being invertible. As illustrated in FIG. 2, bank address pins for BA[1:0] are directly connected to the DRAM chips 212 on a first half of the memory module 204 (i.e., A-Side). Read commands to the A-side of memory module 204 will return data patterns from the selected MPR locations as expected. However, bank address pins for BA[1:0] are inverted to the DRAM chips 212 on a second half of the memory module 204 (i.e., B-Side). Read commands to the B-side of memory module 204 will result in the returning of unexpected data patterns from BA addresses inverted to relative to the BA address bits provided from RCD 214. Accordingly, this inversion of BA address bits needs to be accounted for in order to obtain proper read training results. In some embodiments, the memory PHY 202 issues a read command with the same BA[1:0] address to both the A-Side and the B-side of the memory module 204. For DRAM chips 212 on the A-Side of the memory module 204, the memory PHY 202 expects a bit pattern from an MPR location associated with that BA[1:0] address to be returned. For DRAM chips 212 on the B-Side of the memory module 204, the memory PHY 202 expects a different bit pattern from an MPR associated with an inverse value of that BA[1:0] address to be returned.

Figure 3:
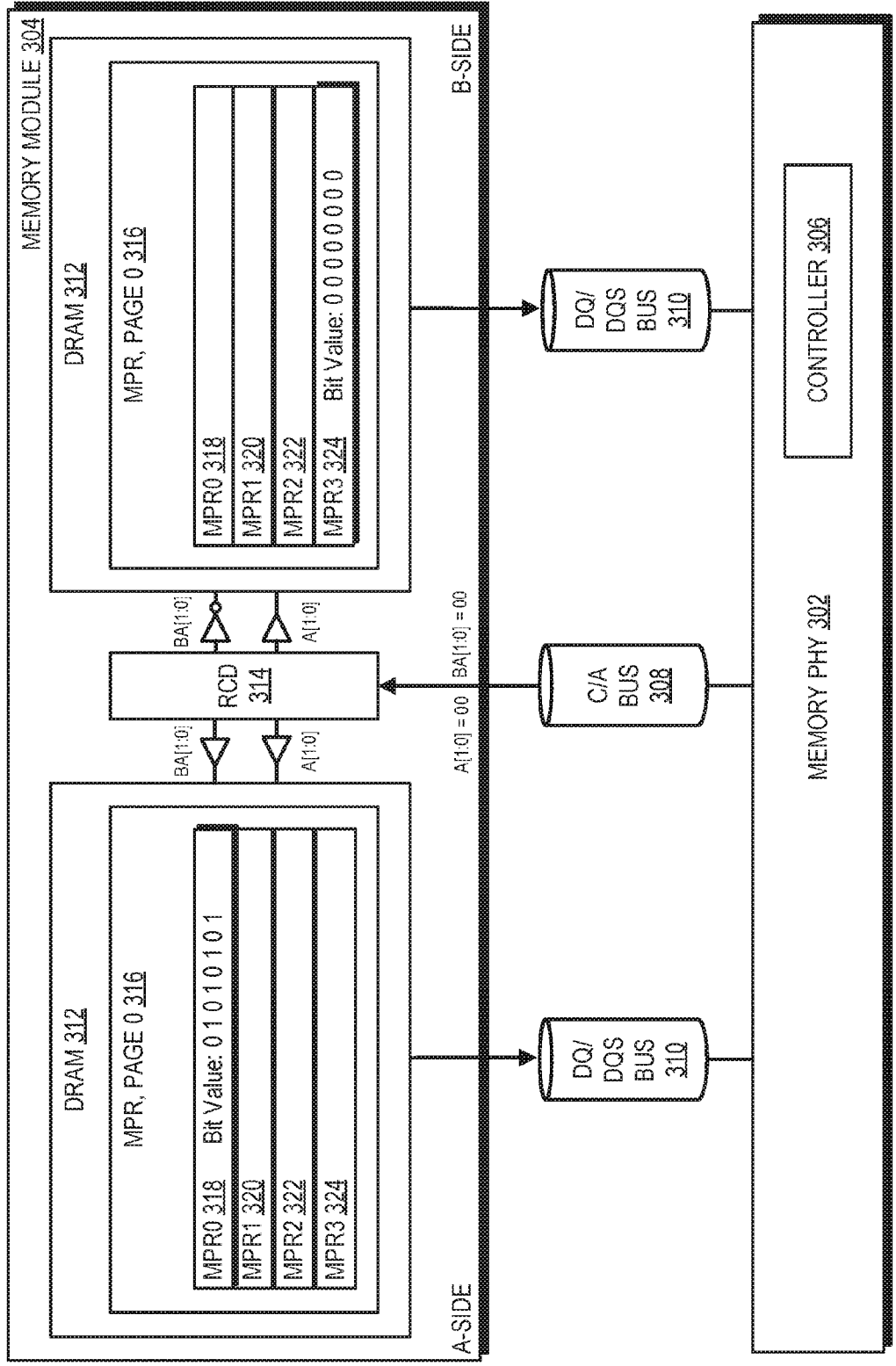
FIG. 3 is a block diagram of a portion of a processing unit that includes a DRAM and MPR register locations within an MPR according to some embodiments.

Referring now to FIG. 3, illustrated is a block diagram of a portion 300 of a processing unit that includes a memory PHY 302 and a memory module 304, such as previously described in FIGS. 1 and 2, according to some embodiments. The memory PHY 302 includes a controller 306 that is used to control read training and write training of the memory PHY 302 for communication with the memory module 304. Some embodiments of the controller 306 may be implemented in hardware, firmware, software, or a combination thereof. The controller 306 may also be referred to as a microcontroller 306 in some embodiments. The controller 306 initiates training in response to power up, vertical retrace frequency changes, power state transitions (e.g., between idle and active states), periodically at a predetermined frequency, or in response to other events or signals. The controller 306 interacts with a BIOS, such as the BIOS 108 shown in FIG. 1. In some embodiments, the BIOS configures the controller 306 by providing configuration information associated with the memory module 304 or instructing the controller 306 to initiate a training sequence in response to the system booting up. However, once the controller 306 has been configured, some embodiments of the controller 306 control training of the memory PHY 302 substantially independently of the BIOS and substantially without input from the BIOS.

The memory PHY 302 and memory module 304 are communicably coupled via a memory bus that includes a command and address (C/A) bus line 308 and data bus lines 310 (e.g., DQ/DQS bus lines 310) on which read and write data is transmitted between the memory PHY 302 and memory module 304. The memory PHY 302 and controller 306 are used to drive data (DQ) or timing (DQS) signals onto or receive the DQ/DQS signals via the data bus lines 310. Further, the memory PHY 302 and controller 306 are used to drive addresses (ADDR) or commands (CMD) over the C/A bus line 308 to the memory module 304, where the ADDR and/or CMD signals are received at a registered clock driver (RCD) 314 that buffers and re-drives command and address signals to the DRAMs 312.

In the embodiment of FIG. 3, the memory module 304 includes DRAM chips 312 that each include one or more multi-purpose registers (MPRs) used for bit pattern storage. The MPRs are accessed with read commands that are issued to their respective DRAM chips 312. Each MPR includes four logical pages (e.g., MPR, Pages 0-3), and wherein each page has four MPR locations. For example, in one embodiment, the four MPR locations are represented as 8-bit programmable registers that are used for bit pattern storage. Each 8-bit register stores a different bit pattern that is used for read training. However, those skilled in the art will recognize that the MPR locations can include registers having bit patterns of any bit length. FIG. 3 illustrates the MPR locations for one particular MPR page, MPR page 0 316, of the DRAMS 312. MPR page 0 316 includes four MPR locations 318-324 (e.g., MPR0-MPR3) that each store a different bit pattern.

Read training is accomplished by sending a read command from the memory PHY 302 and controller 306 to the memory module 304, where the read command is received at the RCD 314. The RCD 314 forwards the read commend to the DRAMs 312, which includes addressing address bits A1:A0 (e.g., A[1:0] as illustrated in FIG. 3) and bank address bits BA1:BA0 (e.g., BA[1:0] as illustrated in FIG. 3). The two bit A1:A0 values are used to indicate which of the MPR pages (e.g., MPR pages 0-3) are selected, and the two bit BA1:BA0 values are used to indicate the MPR location (e.g., MPR0-MPR3) within the selected MPR page from which bit patterns are read. For example, when the bit value "00" is addressed to A1:A0, MPR page 0 316 is selected as illustrated in FIG. 3. Alternatively, addressing A1:A0 using bit value "01" selects MPR page 1, addressing A1:A0 using bit value "10" selects MPR page 2, and addressing A1:A0 using bit value "11" selects MPR page 3.

Within the selected MPR page 0 316, the bank address bits BA1:BA0 are used to specify MPR location, and the registers at the specified MPR location are accessed with the read command to drive the bit patterns onto the DQ/DQS bus 310 for transfer to the memory PHY 302 for read training. For example, when the bit value "00" is addressed to BA1:BA0, MPR0 318 is selected. Alternatively, addressing BA1:BA0 using bit value "01" selects MPR1 320, addressing BA1:BA0 using bit value "10" selects MPR2 322, and addressing BA1:BA0 using bit value "11" selects MPR3 324. The bit pattern received at the memory PHY 302 is compared to an expected pattern for performing read training. However, training errors can occur due to the bank address pins for BA1 and BA0 being invertible.

As illustrated in FIG. 3, bank address pins for BA[1:0] are directly connected to the DRAM chips 312 on a first half of the memory module 304 (i.e., A-Side). Read commands to the A-side of memory module 304 will return data patterns from the selected MPR locations as expected. As shown in FIG. 3, a read command that addresses BA[1:0] using the bit value "00" will return the data pattern "01010101" from MPR0 318. The bit pattern from MPR0 318 is driven onto the DQ/DQS bus 310 and transferred to the memory PHY 302 for read training.

In some embodiments, read training includes configuring the memory module 304 by comparing the received data pattern returned from the addressed MPR against an expected data pattern, and adjusting the timing at which the memory controller 306 will activate to sample read data from the DRAM chips 312 such that the received data pattern matches the expected data pattern. For example, the controller 306 compares bit patterns received from the DRAM chips 312 to the expected data pattern (e.g., training sequences provided to the MPRs of DRAM 312) to determine whether to adjust timing parameters or voltage offset parameters used by the memory PHY 302. For example, prior to starting read training, the controller 306 configures timing parameters or voltage offset parameters used by the memory PHY 302. The controller 306 then compares the training sequences previously provided and written into the MPRs against bit pattern sequences that have been received from the DRAM 312. The controller 306 correlates the training sequences and the received bit patterns at a plurality of different delays. Based on the comparison, the controller 306 decides whether to adjust the timing parameters or the voltage offset parameters, e.g., by incrementing or decrementing one or more of these parameters. For example, a timing offset may be increased or decreased based on the delay determined based on the correlation of the training sequences and the received bit patterns. Some embodiments of the controller 306 also implement data filters or binary adders with upper or lower threshold comparison logic to train to a data contour eye position. The data contour eye is framed on both ends of a clock edge, and data bits are transferred on the data bus (e.g., DQ/DQS bus 310) in response to both the rising edge and the falling edge of a system clock (e.g., CLK 122 of FIG. 1).

However, bank address pins for BA[1:0] are inverted to the DRAM chips 312 on a second half of the memory module 304 (i.e., B-Side). Read commands to the B-side of memory module 304 will result in the returning of unexpected data patterns from BA addresses inverted to relative to the BA address bits provided from RCD 314. For example, as shown in FIG. 3, a read command that addresses BA[1:0] using the bit value "00" will be inverted to the bit value of "11" on the B-side of memory module 304, resulting in the return of data pattern "00000000" from MPR3 324. The bit pattern from MPR3 324 is driven onto the DQ/DQS bus 310 and transferred to the memory PHY 302 for read training. This return of the bit pattern from MPR location MPR3 324 is unexpected due to the memory PHY 302 initially requesting a read from MPR0 318 using bit value "00" to address the BA address bits, and the unexpected return needs to be corrected to obtain proper read training results.

Figure 4:
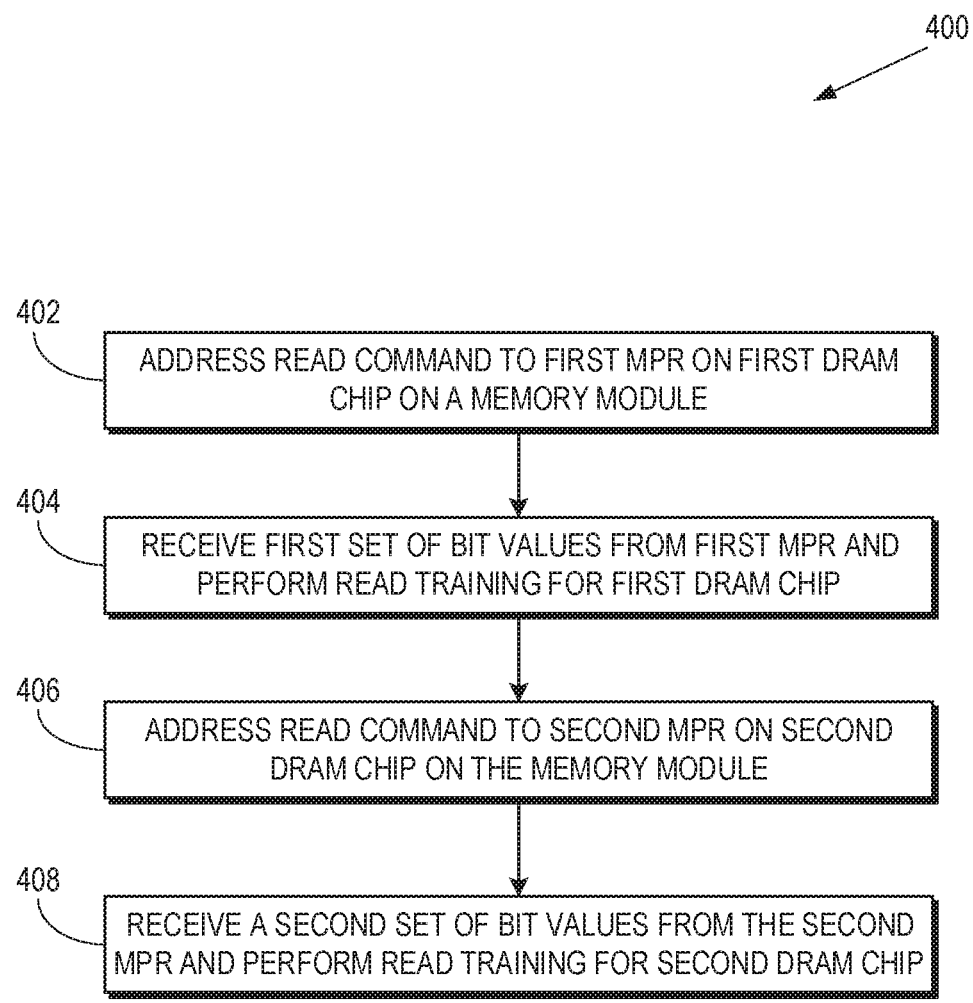
FIG. 4 is a flow diagram illustrating a method using MPR pages for read training according to some embodiments.

FIG. 4 is a flow diagram of a method 400 of training a memory PHY that may be implemented in a processing unit such as the accelerated processing unit 100 shown in FIG. 1 according to some embodiments. Embodiments of the method 400 may be implemented in training control logic such as the training control logic 126 shown in FIG. 1 or the controller 206 shown in FIG. 2.

At block 402, a read command is addressed to a first register address in a multi-purpose register (MPR) of a first dynamic random access memory (DRAM) chip on a memory module. In one embodiment, such as described relative to FIG. 3, a memory module 304 includes DRAM chips 312 that each include one or more multi-purpose registers (MPRs) used for bit pattern storage. The MPRs are accessed with read commands that are issued to their respective DRAM chips 312. Each MPR includes four logical pages (e.g., MPR, Pages 0-3), and wherein each page has four MPR locations. For example, in one embodiment, the four MPR locations are represented as 8-bit programmable registers that are used for bit pattern storage. Each 8-bit register stores a different bit pattern that is used for read training. However, those skilled in the art will recognize that the MPR locations can include registers having bit patterns of any bit length. FIG. 3 illustrates the MPR locations for one particular MPR page, MPR page 0 316, of the DRAMS 312. MPR page 0 316 includes four MPR locations 318-324 (e.g., MPR0-MPR3) that each store a different bit pattern. The bank address bits BA1:BA0 are used to indicated MPR location, and the registers at the specified MPR location are accessed with the read command designating a register address to drive the bit patterns onto the DQ/DQS bus 310 for transfer to the memory PHY 302 for read training.

At block 404, the memory controller receives, in response to addressing the read command to the first register address, a first set of bit values stored at a first register associated with the first register address and performing read training for the first DRAM chip using the first set of bit values. For example, when the bit value "00" is addressed to BA1:BA0, MPR0 318 is selected. Alternatively, addressing BA1:BA0 using bit value "01" selects MPR1 320, addressing BA1: BA0 using bit value "10" selects MPR2 322, and addressing BA1:BA0 using bit value "11" selects MPR3 324. The bit pattern received at the memory PHY 302 is compared relative to an expected pattern for performing read training. As illustrated in FIG. 3, bank address pins for BA[1:0] are directly connected to the DRAM chips 312 on a first half of the memory module 304 (i.e., A-Side). Read commands to the A-side of memory module 304 will return data patterns from the selected MPR locations as expected. As shown in FIG. 3, a read command that addresses BA[1:0] using the bit value "00" will return the data pattern "01010101" from MPR0 318. The bit pattern from MPR0 318 is driven onto the DQ/DQS bus 310 and transferred to the memory PHY 302 for read training.

At block 406, a read command is addressed to the first register address in an MPR of a second DRAM chip on the memory module. In one embodiment, the same bit value "00" is used to address the second DRAM chip (e.g., a DRAM chip 312 on a second half of the memory module 304 (i.e., B-Side)). However, bank address pins for BA[1:0] are inverted to the DRAM chips 312 on a second half of the memory module 304. Read commands to the B-side of memory module 304 will result in the returning of unexpected data patterns from BA addresses inverted to relative to the BA address bits provided from RCD 314.

At block 408, the memory controller receives, in response to addressing the read command to the first register address, a second set of bit values stored at a second register associated with a second register address and performing read training for the second DRAM chip using the second set of bit values. For example, as shown in FIG. 3, a read command that addresses BA[1:0] using the bit value "00" will be inverted to the bit value of "11" on the B-side of memory module 304, resulting in the return of data pattern "00000000" from MPR3 324. The bit pattern from MPR3 324 is driven onto the DQ/DQS bus 310 and transferred to the memory PHY 302 for read training. To properly perform read training, the controller 306 should expect the returned data pattern from the B-side of memory module 304 to originate from register addresses inverted relative to those originally transmitted to the RCD. For example, read commands to the B-side of memory module 304 that address BA[1:0] using the bit value "00" should be expected to return bit patterns from MPR3 associated with register address "11" (as opposed to MPR0 for the A-side). Read commands to the B-side of memory module 304 that address BA[1:0] using the bit value "11" should be expected to return bit patterns from MPR0 associated with register address "00" (as opposed to MPR3 for the A-side). Read commands to the B-side of memory module 304 that address BA[1:0] using the bit value "01" should be expected to return bit patterns from MPR2 associated with register address "10" (as opposed to MPR1 for the A-side). Read commands to the B-side of memory module 304 that address BA[1:0] using the bit value "10" should be expected to return bit patterns from MPR1 associated with register address "01" (as opposed to MPR2 for the A-side).

In some embodiments, the method 400 further includes masking off the second set of bit values from the second MPR, while addressing the read command to the first MPR and performing read training for the first DRAM chip. In some embodiments, the method 400 further includes masking off the first set of bit values from the first MPR, while addressing the read command to the second MPR and performing read training for the second DRAM chip. This provides a way of ignoring the bit values that the memory PHY or controller does not use during read training. For example, while addressing DRAM chips on a first side of the memory module and performing read training by using a first bit pattern (e.g., 01010101 from MPR0), a second bit pattern (e.g., 00000000 from MPR3) returned from DRAM chips on a second side of the memory module due to address pin inversion would be irrelevant for use in read training.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method, comprising:
    addressing a read command to a first register address in a first multi-purpose register (MPR) of a first dynamic random access memory (DRAM) chip on a memory module;
    receiving, in response to addressing the read command to the first register address in the first MPR, a first set of bit values stored at a first register associated with the first register address;
    performing read training for the first DRAM chip using the first set of bit values;
    addressing the read command to the first register address in a second MPR of a second DRAM chip on the memory module;
    receiving, in response to addressing the read command to the first register address in the second MPR, a second set of bit values stored at a second register associated with a second register address; and
    performing read training for the second DRAM chip using the second set of bit values.

2. The method of claim 1, wherein addressing the read command to the first MPR comprises requesting data from a first read location at MPR0 of the first MPR.

3. The method of claim 2, wherein addressing the read command to the second MPR comprises requesting data from a first read location at MPR0 of the second MPR.

4. The method of claim 3, wherein:
    the second MPR includes a second read location at MPR3; and
    receiving the second set of bit values from the second MPR comprises receiving data from MPR3 in response to requesting data from MPR0.

5. The method of claim 2, wherein addressing the read command to the second MPR comprises requesting data from a first location at MPR3 of the second MPR.

6. The method of claim 5, wherein:
    the second MPR includes a second read location at MPR0; and
    receiving the second set of bit values from the second MPR comprises receiving data from MPR0 in response to requesting data from MPR3.

7. The method of claim 1, further comprising:
    masking off, while addressing the read command to the first MPR and performing read training for the first DRAM chip, the second set of bit values from the second MPR.

8. The method of claim 1, further comprising:
    masking off, while addressing the read command to the second MPR and performing read training for the second DRAM chip, the first set of bit values from the first MPR.

9. A non-transitory computer readable medium embodying a set of executable instructions, the set of executable instructions to manipulate a computer system to perform a portion of a process to fabricate at least part of a processor, the processor comprising:
    a memory module having a first dynamic random access memory (DRAM) chip and a second DRAM chip;
    a memory controller to issue a read command to a first register address in a first multi-purpose register (MPR) of the first DRAM chip and further to issue the read command to the first register address in a second MPR of the second DRAM chip; and
    a data bus to receive a first set of bit values from the first MPR and further to receive a second set of bit values from the second MPR, wherein the first and second set of bit values are used by the memory controller to perform read training for the first and second DRAM chips.

10. The non-transitory computer readable medium of claim 9, wherein the read command to the first register address in the first MPR comprises a request for data from a first read location at MPR0 of the first MPR.

11. The non-transitory computer readable medium of claim 10, wherein the read command to the first register address in the second MPR comprises a request for data from a first read location at MPR0 of the second MPR.

12. The non-transitory computer readable medium of claim 11, wherein the second MPR includes a second read location at MPR3, and further wherein the second set of bit values received from the second MPR comprises data from MPR3 in response to the request for data from MPR0.

13. The non-transitory computer readable medium of claim 10, wherein the read command to the first register address in the second MPR comprises a request for data from a first read location at MPR3 of the second MPR.

14. The non-transitory computer readable medium of claim 13, wherein the second MPR includes a second read location at MPR0, and further wherein the second set of bit values from the second MPR comprises data from MPR0 in response to the request for data from MPR3.

15. The non-transitory computer readable medium of claim 9, wherein the processor is to:
    mask off, in response to the read command to the first MPR, the second set of bit values from the second MPR.

16. The non-transitory computer readable medium of claim 9, wherein the processor is to:
    mask off, in response to the read command to the second MPR, the first set of bit values from the first MPR.

17. A processor, comprising:
    a memory interface configured to:
        issue a read command to a first register address in a first multi-purpose register (MPR) of a first dynamic random access memory (DRAM) chip on a memory module;
        receive, in response to the read command, a first set of bit values from the first MPR;
        perform read training for the first DRAM chip using the first set of bit values;
        issue the read command to the first register address in a second MPR of a second DRAM chip on the memory module;
        receive, in response to the read command, a second set of bit values from the second MPR; and
        perform read training for the second DRAM chip using the second set of bit values.

18. The processor of claim 17, wherein the read command to the first register address in the first MPR comprises a request for data from a first read location at MPR0 of the first MPR.

19. The processor of claim 18, wherein:
the read command to the first register address in the second MPR comprises a request for data from a first read location at MPR0 of the second MPR; and
data from a second read location at MPR3 is received in response to the request for data from MPR0.

20. The processor of claim 18, wherein:
the read command to the first register address in the second MPR comprises a request for data from a first read location at MPR3 of the second MPR; and
data from a second read location at MPR0 is received in response to the request for data from MPR3.

\* \* \* \* \*